(12) United States Patent
Zhou et al.

(10) Patent No.: US 11,258,335 B2
(45) Date of Patent: Feb. 22, 2022

(54) MOTOR STATOR ANTI-INTERFERENCES STRUCTURE

(71) Applicant: ASIA VITAL COMPONENTS (CHINA) CO., LTD., Shenzhen (CN)

(72) Inventors: Feng Zhou, Shenzhen (CN); Chih-Cheng Lai, Shenzhen (CN)

(73) Assignee: Asia Vital Components (China) Co., Ltd., Shenzhen (CN)

( * ) Notice: Subject to any disclaimer, the term of this patent is extended or adjusted under 35 U.S.C. 154(b) by 35 days.

(21) Appl. No.: 16/897,278

(22) Filed: Jun. 10, 2020

(65) Prior Publication Data

US 2021/0391772 A1    Dec. 16, 2021

(51) Int. Cl.
*H02K 11/01* (2016.01)
*H05K 9/00* (2006.01)
*H02K 11/40* (2016.01)

(52) U.S. Cl.
CPC ........... *H02K 11/01* (2016.01); *H02K 11/014* (2020.08); *H02K 11/40* (2016.01); *H05K 9/0088* (2013.01)

(58) Field of Classification Search
CPC ............................. H02K 11/026; H02K 11/014
See application file for complete search history.

(56) References Cited

U.S. PATENT DOCUMENTS

| | | | | |
|---|---|---|---|---|
| 2006/0022551 A1* | 2/2006 | Ku | .......................... | H02K 11/00 310/254.1 |
| 2010/0084950 A1* | 4/2010 | Onozawa | ............... | H02K 29/08 310/68 B |
| 2011/0001384 A1* | 1/2011 | Segawa | ................... | H02K 7/063 310/195 |
| 2014/0097727 A1* | 4/2014 | Qi | ........................... | H02K 11/33 310/68 B |
| 2014/0175954 A1* | 6/2014 | Chang | .................... | H02K 5/1675 310/68 R |
| 2016/0043598 A1 | 2/2016 | Chang et al. | | |
| 2016/0211728 A1* | 7/2016 | Yin | ......................... | H02K 5/04 |
| 2017/0366063 A1* | 12/2017 | Matsuda | .............. | H02K 1/2786 |
| 2018/0076696 A1* | 3/2018 | Mizuike et al. | ........ | H02K 1/16 |
| 2019/0131858 A1* | 5/2019 | Mizukami | .......... | H02K 11/0094 |
| 2019/0245406 A1* | 8/2019 | Horng | ...................... | H02K 3/50 |
| 2020/0185997 A1* | 6/2020 | Hirasawa | ........... | H02K 15/0062 |

FOREIGN PATENT DOCUMENTS

| | | |
|---|---|---|
| TW | 200419877 | 10/2004 |
| TW | 200640110 | 11/2006 |
| TW | 201312904 A1 | 3/2013 |
| TW | 201843918 A | 12/2018 |

* cited by examiner

*Primary Examiner* — Hung V Ngo
(74) *Attorney, Agent, or Firm* — Bradley J. Thorson; DeWitt LLP

(57) ABSTRACT

A motor stator anti-interference structure includes: a silicon steel sheet assembly, the silicon steel sheet assembly including multiple silicon steel sheets held between an insulation support assembly; a winding assembly wound on the silicon steel sheet assembly and the insulation support assembly; and a connection member inlaid in the silicon steel sheet assembly to contact all the silicon steel sheets. All the silicon steel sheets are connected to a grounding end of a circuit board through the connection member so as to increase contact area between the connection member and the silicon steel sheet assembly. The electromagnetic interference is conducted through the connection member to the grounding end of the circuit board.

12 Claims, 9 Drawing Sheets

MOTOR STATOR ANTI-INTERFERENCES STRUCTURE

BACKGROUND OF THE INVENTION

1. Field of the Invention

The present invention relates generally to an anti-electromagnetic interference structure, and more particularly to a motor stator anti-interference structure.

2. Description of the Related Art

In operation, the conventional motor has the problem of electromagnetic compatibility (EMC), that is, the problems of electromagnetic interference (EMI) and electromagnetic suspension (EMS). In other words, when conducting current in an electromagnetic field, along with the effect of the voltage and current, the components or devices in adjacency to the motor will be subjected to electromagnetic interference to deteriorate the performance of the device, equipment or system. As a result, the components or devices in adjacency to the motor may malfunction.

In order to reduce the electromagnetic interference, generally an electronic component or electro-conductive material is added onto the circuit board so as to minify the electromagnetic interference or increase the electromagnetic suspension. However, the added electronic component or electro-conductive material will affect the properties of the motor. Also, the electronic component or electro-conductive material will lead to increase of cost and can only achieve limited effect.

It is therefore tried by the applicant to provide a motor stator anti-interference structure to solve the above problems existing in the conventional motor.

SUMMARY OF THE INVENTION

It is therefore a primary object of the present invention to provide a motor stator anti-interference structure includes a silicon steel sheet assembly and a connection member. The connection member is inlaid in the silicon steel sheet assembly to contact all the silicon steel sheets so as to increase contact area between the connection member and the silicon steel sheet assembly. All the silicon steel sheets are electrically connected to a grounding end of a circuit board through the connection member, whereby the electromagnetic interference is conducted through the connection member to the grounding end of the circuit board. Accordingly, when the motor operates, the electromagnetic interference is minified or the electromagnetic suspension is increased.

It is a further object of the present invention to provide the above motor stator anti-interference structure, in which the connection member is inlaid in the silicon steel sheet assembly so that the installation is facilitated and the structure is simplified to lower the cost.

To achieve the above and other objects, the motor stator anti-interference structure of the present invention includes: a circuit board; a silicon steel sheet assembly, the silicon steel sheet assembly including multiple stacked silicon steel sheets, each silicon steel sheet being formed with a split, the splits being aligned with each other to together form a connection section; a connection member connected with the connection section to contact all the silicon steel sheets, the connection member having a protrusion end protruding from the silicon steel sheet assembly; an insulation support assembly disposed on an upper side and a lower side of the silicon steel sheet assembly, the protrusion end of the connection member protruding from the insulation support assembly to expose to outer side; and a winding assembly wound on the silicon steel sheet assembly and the insulation support assembly, the winding assembly having a connection end, the connection end of the winding assembly and the protrusion end of the connection member being electrically connected with the circuit board.

In the above motor stator anti-interference structure, the silicon steel sheet assembly includes a circular section and multiple pole sections radially distributed on outer circumference of the circular section. The connection section formed of the splits is positioned on the circular section.

In the above motor stator anti-interference structure, the silicon steel sheet assembly includes a circular section and multiple pole sections radially distributed on outer circumference of the circular section. The connection section formed of the splits is positioned on one of the pole sections.

In the above motor stator anti-interference structure, each pole section includes a magnetic pole and a magnetic pole face circumferentially extending from a free end of each magnetic pole. The connection section is positioned on the magnetic pole face.

In the above motor stator anti-interference structure, the insulation support assembly includes an upper insulation support and a lower insulation support. The silicon steel sheet assembly is disposed between the upper and lower insulation supports. One of the upper and lower insulation supports is formed with an insulation support hole. The protrusion end of the connection member extends through the insulation support hole to expose to outer side.

In the above motor stator anti-interference structure, the circuit board includes an electro-conductive end and a grounding end. The connection end of the winding assembly is connected with the electro-conductive end. The protrusion end of the connection member is connected with the grounding end.

Still to achieve the above and other objects, the motor stator anti-interference structure of the present invention includes: a silicon steel sheet assembly, the silicon steel sheet assembly including multiple silicon steel sheets held between an insulation support assembly; a connection member inlaid in the silicon steel sheet assembly, the connection member having a contact section in contact with all the silicon steel sheets to increase contact area between the silicon steel sheet assembly and the connection member, the contact section having a protrusion end protruding from the silicon steel sheet assembly and the insulation support assembly to connect with a circuit board; and a winding assembly wound on the silicon steel sheet assembly and the insulation support assembly, the winding assembly having a connection end connected with the circuit board.

In the above motor stator anti-interference structure, the silicon steel sheet assembly includes a circular section and multiple pole sections radially distributed on outer circumference of the circular section. The connection section is inlaid in the circular section.

In the above motor stator anti-interference structure, the silicon steel sheet assembly includes a circular section and multiple pole sections radially distributed on outer circumference of the circular section. The connection section is inlaid in one of the pole sections.

In the above motor stator anti-interference structure, each pole section includes a magnetic pole and a magnetic pole face circumferentially extending from a free end of each magnetic pole. The connection section is inlaid in the magnetic pole face.

In the above motor stator anti-interference structure, each silicon steel sheet is formed with a split. The splits are aligned with each other to together form a connection section, in which the connection member is inlaid.

Still to achieve the above and other objects, the motor stator anti-interference structure of the present invention includes: a circuit board having an electro-conductive end and a grounding end; a stator including a silicon steel sheet assembly, the silicon steel sheet assembly being disposed between an insulation support assembly and including multiple silicon steel sheets, the surfaces of all the silicon steel sheets being in contact with the same connection member and electrically connected to the grounding end of the circuit board through the connection member; and a winding assembly wound on the silicon steel sheet assembly and the insulation support assembly and electrically connected to the electro-conductive end of the circuit board to power and magnetize all the silicon steel sheets of the silicon steel sheet assembly. After magnetized, the produced electromagnetic interference is conducted through the connection member to the grounding end of the circuit board.

The silicon steel sheets are stacked and each silicon steel sheet is formed with a split. The splits are aligned with each other to together form a connection section connected with the connection member.

In the above motor stator anti-interference structure, the connection member has a contact section and a protrusion end. The contact section is disposed in the connection section in contact with the surfaces of all the silicon steel sheets. The protrusion end extends from the contact section to protrude from the silicon steel sheet assembly and the insulation support assembly to connect with the grounding end of the circuit board.

In the above motor stator anti-interference structure, the silicon steel sheet assembly includes a circular section and multiple pole sections radially distributed on outer circumference of the circular section. The connection section contacts the circular section.

In the above motor stator anti-interference structure, the silicon steel sheet assembly includes a circular section and multiple pole sections radially distributed on outer circumference of the circular section. The connection section contacts one of the pole sections.

In the above motor stator anti-interference structure, each pole section includes a magnetic pole and a magnetic pole face circumferentially extending from a free end of each magnetic pole. The connection section contacts the magnetic pole face.

In the above motor stator anti-interference structure, the insulation support assembly includes an upper insulation support and a lower insulation support. The silicon steel sheet assembly is positioned between the upper and lower insulation supports. One of the upper and lower insulation supports is formed with an insulation support hole. The protrusion end of the connection member extends through the insulation support hole to expose to outer side.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
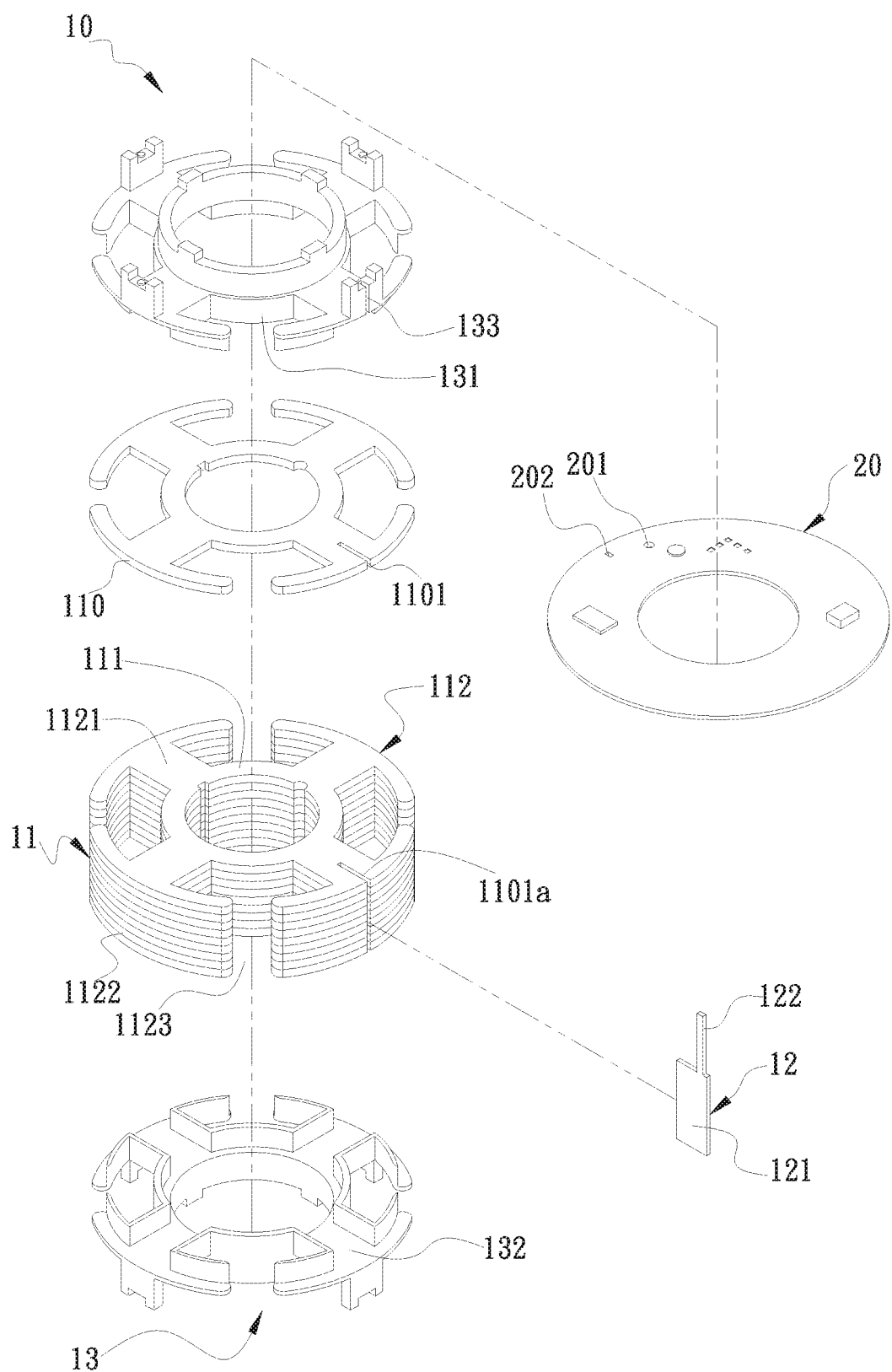
FIG. 1 is a first perspective exploded view of a first embodiment of the present invention.
Figure 2:
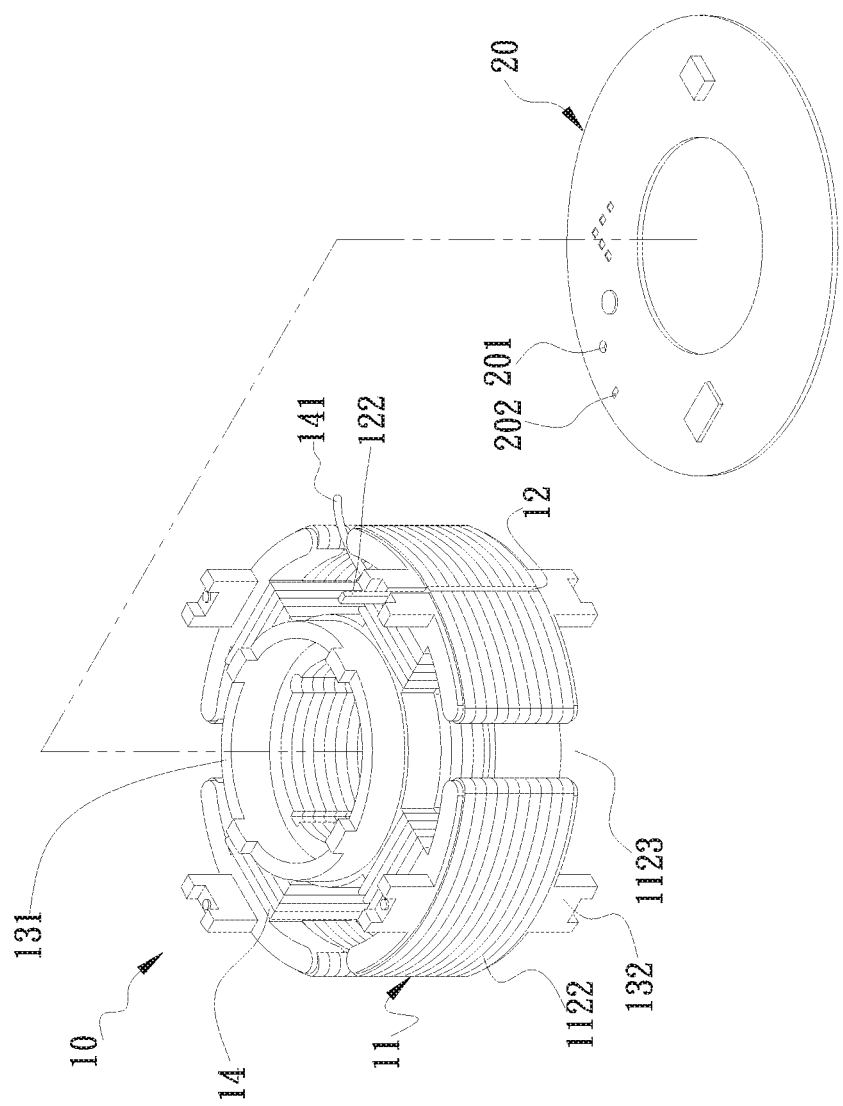
FIG. 2 is a second perspective exploded view of the first embodiment of the present invention.
Figure 3:
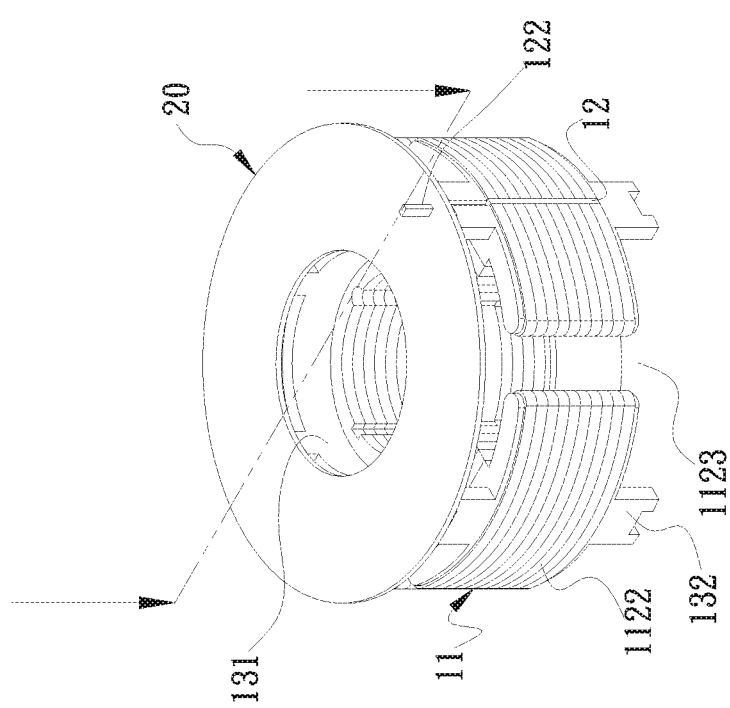
FIG. 3 is a perspective assembled view of the first embodiment of the present invention.
Figure 4A:
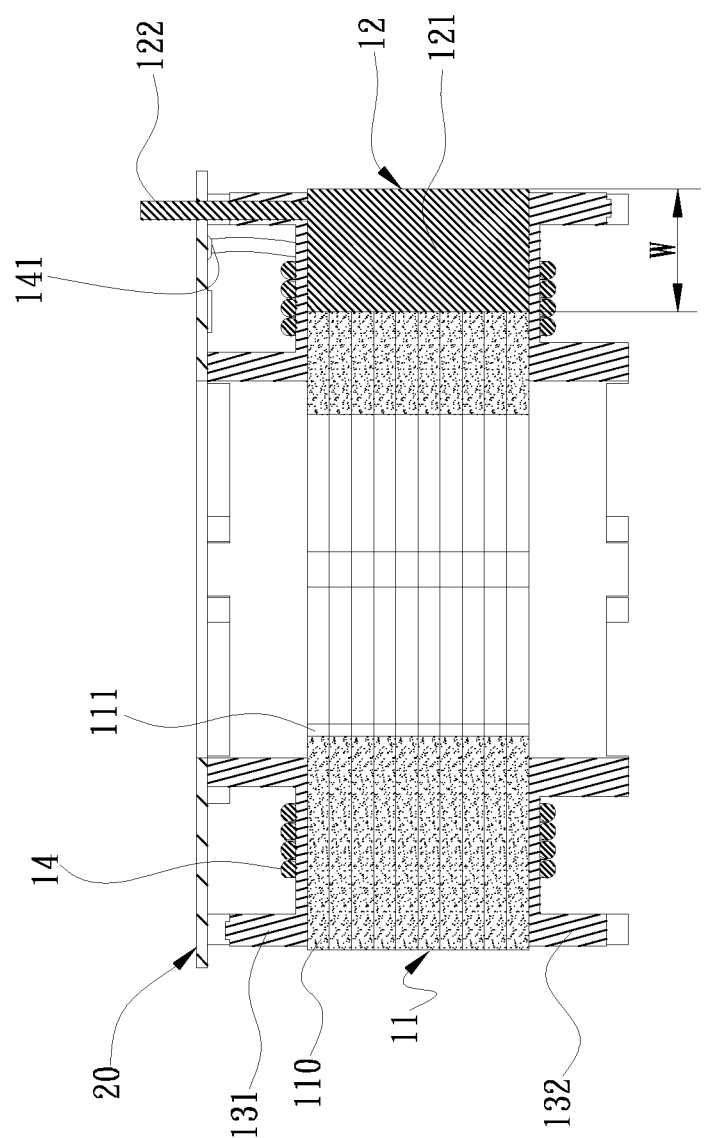
FIGS. 4A and 4B show different aspects of the connection member of the first embodiment of the present invention.
Figure 4B:
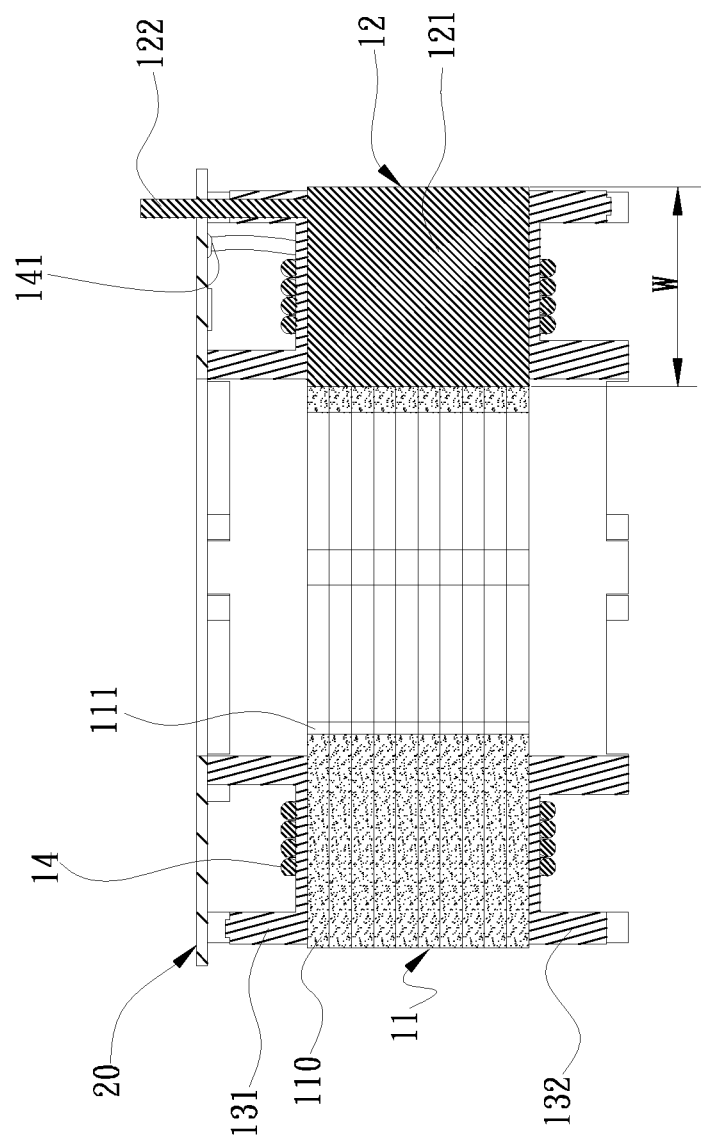
Figure 5:
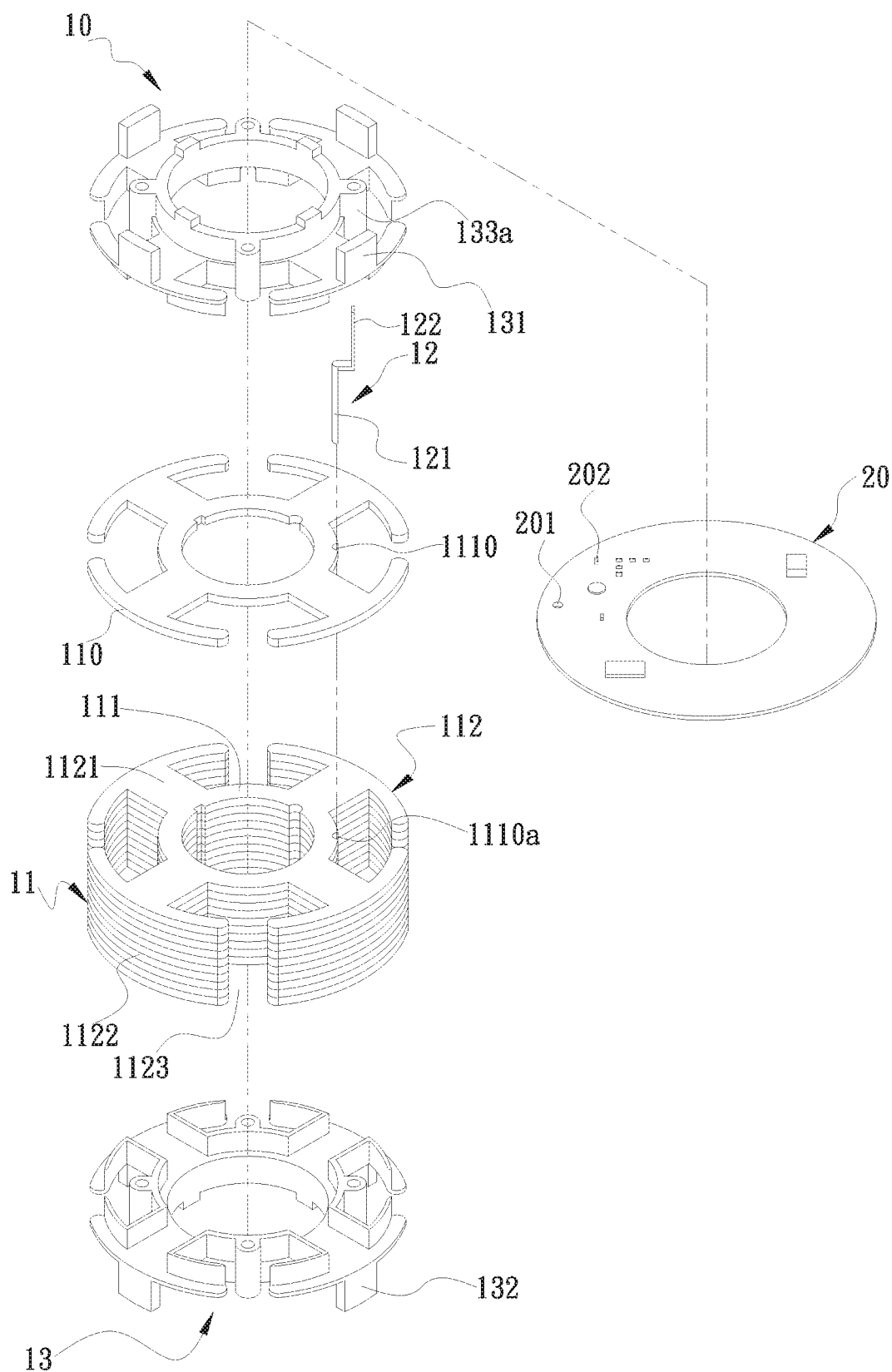
FIGS. 5 to 8 show the second embodiment of the present invention.
Figure 6:
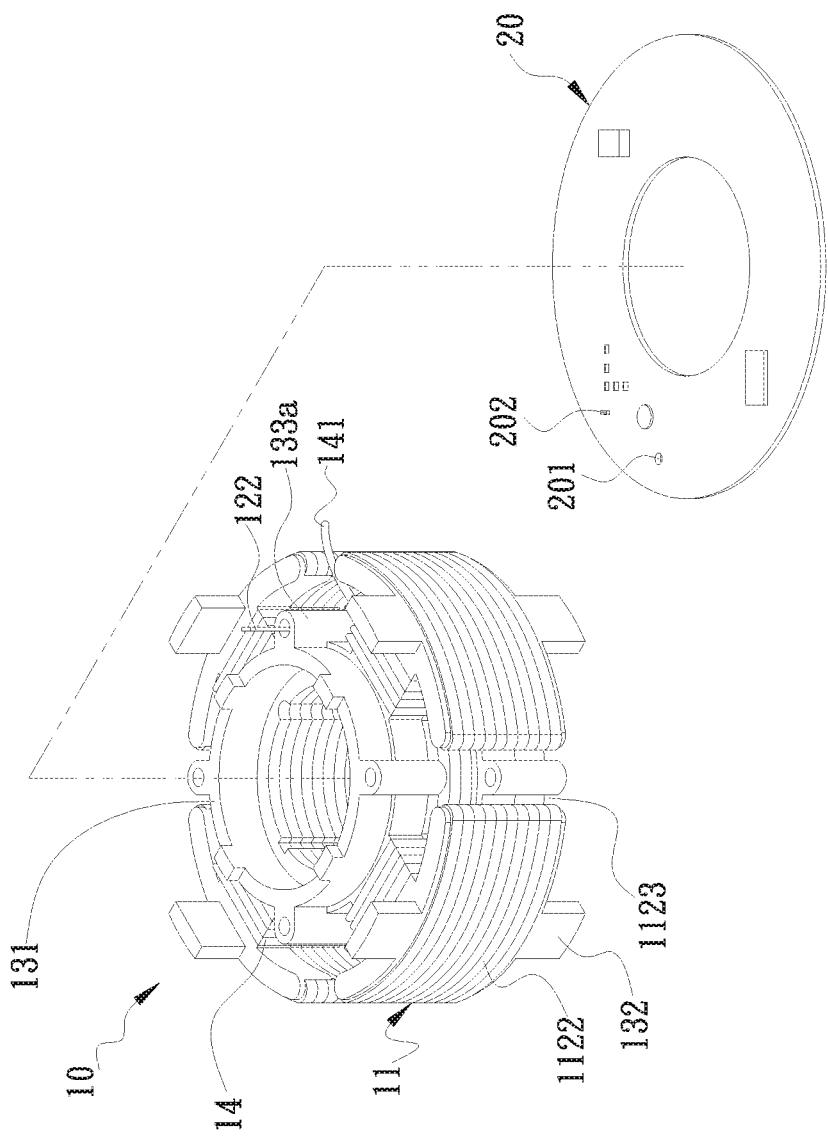
Figure 7:
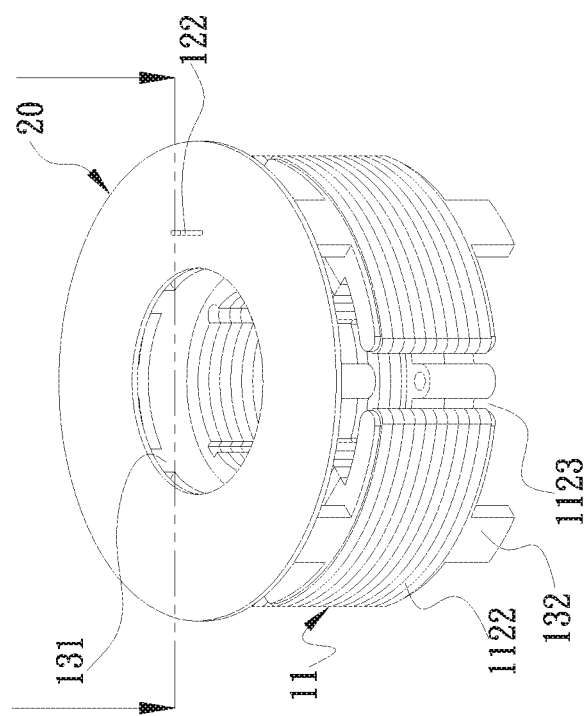
Figure 8:
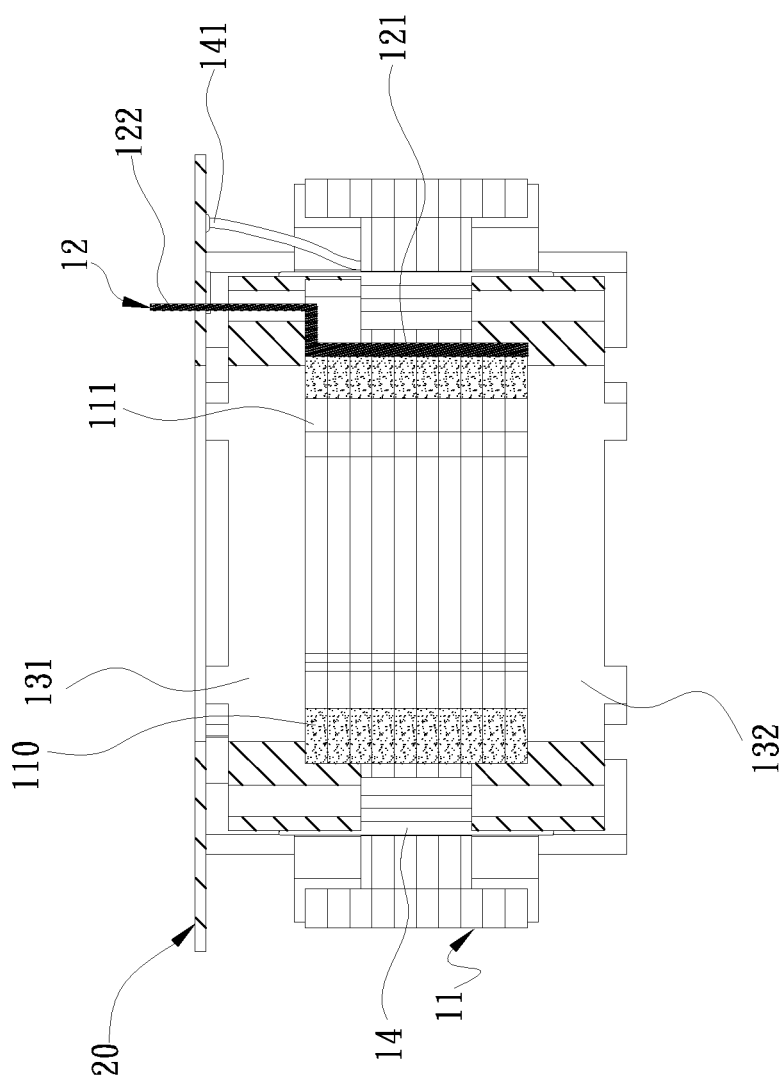

Please refer to FIGS. 1 to 4B. FIG. 1 is a first perspective exploded view of a first embodiment of the present invention. FIG. 2 is a second perspective exploded view of the first embodiment of the present invention. FIG. 3 is a perspective assembled view of the first embodiment of the present invention. FIGS. 4A and 4B show different aspects of the connection member of the first embodiment of the present invention. The motor stator anti-interference structure of the present invention includes a stator 10 and a circuit board 20. The stator 10 includes a silicon steel sheet assembly 11, a connection member 12, an insulation support assembly 13 and a winding assembly 14. The silicon steel sheet assembly 11 includes multiple stacked silicon steel sheets 110. In addition, the silicon steel sheet assembly 11 includes a circular section 111 and multiple pole sections 112 radially distributed on outer circumference of the circular section 111. Each pole section 112 has a magnetic pole 1121 connected with the outer surface of the circular section 111. A magnetic pole face 1122 circumferentially extends from a free end of each magnetic pole 112. Each two adjacent magnetic faces 1122 define therebetween a magnetic pole gap 1123.

The silicon steel sheet assembly 11 is disposed between the insulation support assembly 13. The insulation support assembly 13 includes an upper insulation support 131 and a lower insulation support 132 respectively disposed on upper and lower sides of the silicon steel sheet assembly 11. Accordingly, the silicon steel sheets 110 are held between the upper and lower insulation supports 131, 132 of the insulation support assembly 13 with the magnetic pole faces 1122 and the outer faces of some silicon steel sheets 110 exposed to outer side.

Each silicon steel sheet 110 is formed with a split 1101. The splits 1101 of the silicon steel sheets 110 are aligned with each other to form a connection section 1101a such as an insertion slit or a socket. In this embodiment, the connection section 1101a formed of the splits 1101 is, but not limited to, disposed on the magnetic pole face 1122 of one of the pole sections 112. Alternatively, the connection section 1101a formed of the splits 1101 can be disposed on the magnetic pole 1121 of one of the pole sections 112.

The winding assembly 14 is wound on the silicon steel sheet assembly 11 and the insulation support assembly 13 already assembled with each other. As shown in the drawings, the winding assembly 14 is wound on all the pole sections 112 and the section of the insulation support assembly 13 corresponding to the pole sections 112 and a connection end 141 is reserved to connect with the circuit board 20 (as shown in FIG. 2).

The connection member 12 is connected with the connection section 1101a of the silicon steel sheet assembly 11. As shown in the drawings, the connection section 1101a is an insertion slit and the connection section 12 is inserted into the connection section 1101a of the magnetic pole face 112.

The connection member 12 has a contact section 121 and a protrusion end 122 extending from the contact section 121. The contact section 121 is inlaid or inserted into the connection section 1101a into direct contact with all the silicon steel sheets 110. The surfaces in the splits 1101 of all the silicon steel sheets 110 can contact the same connection member 12 so that the contact area between the silicon steel sheet assembly 11 and the connection member 12 is increased. The connection member 12 is preferably made of an electro-conductive material such as metal. Moreover, as shown in FIGS. 4A and 4B, the contact section 121 of the connection member 12 has a width W defined between the left side and the right side. The width W is adapted to the inward recessed depth of the connection section 1101a. The width W is such as a narrower width (as shown in FIG. 4A) or a wider width (as shown in FIG. 4B). The wider the width W is, the larger the contact area between the connection section 12 and all the silicon steel sheets 110 is and the more effectively the electromagnetic interference is minified.

The protrusion end 122 protrudes from the silicon steel sheet assembly 11 and the insulation support assembly 13 to connect with the circuit board 20. The upper insulation support 131 and/or the lower insulation support 132 is formed with an insulation support hole 133 for the protrusion end 122 of the connection member 12 to pass through and expose to outer side. In this embodiment, the insulation support hole 133 is formed on the upper insulation support 131 corresponding to the connection section 1101a of one of the pole sections 122. The protrusion end 122 of the connection member 12 passes through the insulation support hole 133 to expose to outer side. The protrusion end 122 exposed to outer side is electrically connected with the circuit board 20.

The circuit board 20 includes an electro-conductive end 201 and a grounding end 202. The connection end 141 of the winding assembly 14 is connected with the electro-conductive end 201. The protrusion end 122 of the connection member 12 is connected with the grounding end 202. Accordingly, when the winding assembly 14 is powered from the electro-conductive end 201 of the circuit board 20, all the silicon steel sheets 110 of the silicon steel sheet assembly 11 are magnetized. At this time, the electromagnetic interference signal accompanying the magnetization of the silicon steel sheets 110 is conducted through the contact section 121 and the protrusion end 122 of the connection member 12 to the grounding end 202 of the circuit board 20.

Please now refer to FIGS. 5 to 8, which show a second embodiment of the present invention. Most of the components of the second embodiment are identical to those of the first embodiment and the same components are denoted with the same reference numerals. The second embodiment is different from the first embodiment in that each silicon steel sheet 110 is formed with a notch 1110. The notches 1110 together form a connection section 1110a positioned on the circular section 111 of the silicon steel sheet assembly 11. The contact section 121 of the connection member 12 is inlaid in the connection section 1110a of the circular section 111 into direct contact with all the silicon steel sheets 110. The insulation support hole 133a is formed on the upper insulation support 131 corresponding to the connection section 1110a of circular section 111. The protrusion end 122 of the connection member 12 passes through the insulation support hole 133a to expose to outer side. The protrusion end 122 exposed to outer side is electrically connected with the circuit board 20.

In the present invention, the connection section 12 is in contact with all the silicon steel sheets 110 of the silicon steel sheet assembly 11 so as to increase the contact area between the connection member 12 and the silicon steel sheet assembly 11. All the silicon steel sheets 110 are electrically connected with the grounding end 202 of the circuit board 20 through the connection member 12. Therefore, the electromagnetic interference is conducted to the grounding end 202 of the circuit board 20. In this case, when the motor operates, the electromagnetic interference is minified or the electromagnetic suspension is increased. Moreover, the connection member 12 is inlaid in the silicon steel sheet assembly 11 so that the installation is facilitated and the structure is simplified to lower the cost.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A motor stator anti-interference structure comprising:
a circuit board;
a silicon steel sheet assembly including multiple stacked silicon steel sheets, each silicon steel sheet being formed with a split, the splits being aligned with each other to together form a connection section;
a connection member connected with the connection section to contact all the silicon steel sheets, the connection member having a protrusion end protruding from the silicon steel sheet assembly;
an insulation support assembly disposed on an upper side and a lower side of the silicon steel sheet assembly, the protrusion end of the connection member protruding from the insulation support assembly to expose to outer side; and
a winding assembly wound on the silicon steel sheet assembly and the insulation support assembly, the winding assembly having a connection end, the connection end of the winding assembly and the protrusion end of the connection member being electrically connected with the circuit board.

2. The motor stator anti-interference structure as claimed in claim 1, wherein the silicon steel sheet assembly includes a circular section and multiple pole sections radially distributed on outer circumference of the circular section, the connection section formed of the splits being positioned on the circular section.

3. The motor stator anti-interference structure as claimed in claim 1, wherein the silicon steel sheet assembly includes a circular section and multiple pole sections radially distributed on outer circumference of the circular section, the connection section formed of the splits being positioned on one of the pole sections.

4. The motor stator anti-interference structure as claimed in claim 3, wherein each pole section includes a magnetic pole and a magnetic pole face circumferentially extending from a free end of each magnetic pole, the connection section being positioned on the magnetic pole face.

5. The motor stator anti-interference structure as claimed in claim 1, wherein the insulation support assembly includes an upper insulation support and a lower insulation support, the silicon steel sheet assembly being disposed between the upper and lower insulation supports, one of the upper and lower insulation supports being formed with an insulation support hole, the protrusion end of the connection member extending through the insulation support hole to expose to outer side.

6. The motor stator anti-interference structure as claimed in claim 1, wherein the circuit board includes an electro-conductive end and a grounding end, the connection end of the winding assembly being connected with the electro-conductive end, the protrusion end of the connection member being connected with the grounding end.

7. A motor stator anti-interference structure comprising:
a silicon steel sheet assembly including multiple silicon steel sheets held between an insulation support assembly;
a connection member inlaid in the silicon steel sheet assembly having a contact section in contact with all the silicon steel sheets to increase contact area between the silicon steel sheet assembly and the connection member, the contact section having a protrusion end protruding from the silicon steel sheet assembly and the insulation support assembly to connect with a circuit board; and
a winding assembly wound on the silicon steel sheet assembly and the insulation support assembly, the winding assembly having a connection end connected with the circuit board.

8. The motor stator anti-interference structure as claimed in claim 7, wherein the silicon steel sheet assembly includes a circular section and multiple pole sections radially distributed on outer circumference of the circular section, the connection section being inlaid in the circular section.

9. The motor stator anti-interference structure as claimed in claim 7, wherein the silicon steel sheet assembly includes a circular section and multiple pole sections radially distributed on outer circumference of the circular section, the connection section being inlaid in one of the pole sections.

10. The motor stator anti-interference structure as claimed in claim 9, wherein each pole section includes a magnetic pole and a magnetic pole face circumferentially extending from a free end of each magnetic pole, the connection section being inlaid in the magnetic pole face.

11. The motor stator anti-interference structure as claimed in claim 7, wherein the insulation support assembly includes an upper insulation support and a lower insulation support, the silicon steel sheet assembly being disposed between the upper and lower insulation supports, one of the upper and lower insulation supports being formed with an insulation support hole, the protrusion end of the connection member extending through the insulation support hole to expose to outer side.

12. The motor stator anti-interference structure as claimed in claim 7, wherein each silicon steel sheet is formed with a split, the splits being aligned with each other to together form a connection section, in which the connection member is inlaid.

* * * * *